United States Patent [19]
Ichikawa et al.

[11] Patent Number: 6,153,349
[45] Date of Patent: Nov. 28, 2000

[54] PHOTO RESIST COMPOSITION

[75] Inventors: Koji Ichikawa, Ashiya; Nobuhito Fukui; Koshiro Ochiai, both of Toyonaka, all of Japan

[73] Assignee: Sumitomo Chemical Company, Limited, Osaka, Japan

[21] Appl. No.: 09/307,036

[22] Filed: May 7, 1999

[30] Foreign Application Priority Data

| May 8, 1998 | [JP] | Japan | ................................. | 10-126023 |
| Dec. 18, 1998 | [JP] | Japan | ................................. | 10-360756 |

[51] Int. Cl.⁷ .................................................. G03F 7/004
[52] U.S. Cl. ........................ 430/170; 430/270.1; 430/905; 430/909
[58] Field of Search ................................ 430/170, 270.1, 430/905, 909

[56] References Cited

U.S. PATENT DOCUMENTS 5,558,971  9/1996  Urano et al. .............................. 430/170

FOREIGN PATENT DOCUMENTS

| 0704762 A1 | 4/1996 | European Pat. Off. . |
| 0756203 A1 | 1/1997 | European Pat. Off. . |
| 0780732 A2 | 6/1997 | European Pat. Off. . |
| 0789279 A1 | 8/1997 | European Pat. Off. . |

*Primary Examiner*—John S. Chu
*Attorney, Agent, or Firm*—Birch, Stewart, Kolasch & Birch, LLP

[57] ABSTRACT

A photoresist composition comprising a resin having structural units represented by the following formulas (I), (II) and (III):

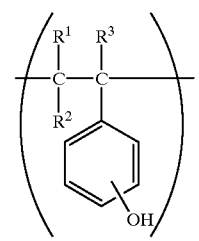

(I)

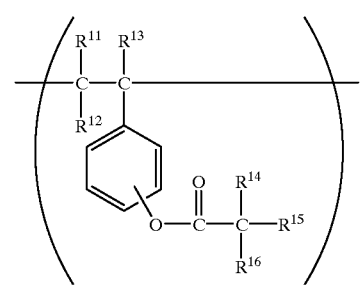

(II)

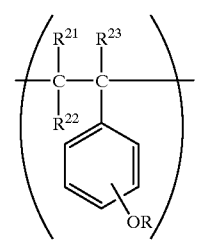

(III)

wherein $R^1$, $R^2$, $R^3$, $R^{11}$, $R^{12}$, $R^{13}$, $R^{21}$, $R^{22}$ and $R^{23}$ each independently represents hydrogen or an alkyl; one of $R^{14}$, $R^{15}$ and $R^{16}$ represents an aliphatic hydrocarbon residue and the rest each independently represents hydrogen or an aliphatic hydrocarbon residue, or two or three of $R^{14}$, $R^{15}$ and $R^{16}$ form a hydrocarbon ring; and R represents a group cleavable by an action of an acid; and the photoresist composition affords excellent resolution, excellent profile and wide focus margin even on a substrate provided with an organic anti-reflective film.

12 Claims, 1 Drawing Sheet

FIG.1

PHOTO RESIST COMPOSITION

BACKGROUND OF THE INVENTION

The present invention relates to a photoresist composition suited for a lithography using high-energy radiations such as far ultraviolet ray (including excimer laser), electron beam, X-ray, emitted light or the like.

DESCRIPTION OF THE RELATED ART

With higher integration of integrated circuits, the formation of a pattern of a quarter micron order has recently been required. In order to satisfy such a requirement, an excimer laser lithography capable of producing 64 M DRAM and 256 M DRAM has attracted special interest. As a resist suited for an excimer laser lithography, a so-called chemical amplification type photoresist utilizing an acid catalyst and a chemical amplification effect has been employed. Regarding the chemical amplification type photoresist, the solubility of the exposed portion in an alkali developer is changed by a reaction in the presence of an acid, as a catalyst, generated from an acid generator at the radiation-exposed portion. thereby affording a positive or negative pattern.

For higher integration of semiconductor integrated circuits, the reduction in the processing size of lithography has rapidly proceeded, and a chemical amplification type resist capable of obtaining a finer resist pattern has increasingly demanded. With the reduction in size of the resist pattern, a demand for the resist pattern shape has become severer and those capable of affording a nearly rectangular pattern have been required.

Furthermore, it is required that the photoresist is superior in transparency to radiation and that photolithography is conducted on various substrates. In the case of a substrate having a high reflectance to light, a problem such as thin profile and collapse of the pattern is liable to occur. Therefore, in order to avoid unnecessary light exposure of a photoresist by reflected light from the substrate, a substrate provided with an anti-reflective film on the surface is sometimes required. However, when the photolithography is conducted on the substrate provided with the anti-reflective film on the surface, there is a problem that the resulting profile has a bottom-extending shape, where the interface between the photoresist pattern and anti-reflective film is extended, or a necking shape, where the interface between the photoresist pattern and anti-reflective film is constricted like the neck.

A photoresist having a wide focus margin is also required. That is, it is required that a photoresist can form a pattern closed to the original mask pattern even if a focus is slightly moved. Particularly, for forming an ultrafine pattern, the above anti-reflective film is often provided in order to prevent collapse of the pattern caused by reflected light, and, therefore, a photoresist having a wide focus margin even on a substrate provided with such an anti-reflective film is required . However, in a conventional photoresist composition, there is a limit in the focus margin.

SUMMARY OF THE INVENTION

An object of the present invention is to provide a photoresist composition which is superior in various performances such as sensitivity, resolution, heat resistance, film retention ratio, coating properties, profile, etc. and is particularly superior in pattern shape.

Another object of the present invention is to provide a photoresist composition having a wide focus margin and capable of affording a good pattern profile, which is nearly rectangular, even on a substrate provided with an anti-reflective film.

The present inventors have studied intensively to attain these objects. As a result, they have found that a photoresist composition having excellent performances can be obtained by using a specific resin. The present invention has thus been completed.

The present invention provides a photoresist composition comprising a resin having, in one molecule, the respective structural units represented by the following formulas (I), (II) and (III):

wherein $R^1$, $R^2$, $R^3$, $R^{11}$, $R^{12}$, $R^{13}$, $R^{21}$, $R^{22}$ and $R^{23}$ each independently represents hydrogen or an alkyl having 1 to 4 carbon atoms; one of $R^{14}$, $R^{15}$ and $R^{16}$ represents an aliphatic hydrocarbon residue and the rest each independently represents hydrogen or an aliphatic hydrocarbon residue, or two or three of $R^{14}$, $R^{15}$ and $R^{16}$ are combined each other together with a carbon atom to which they are bonded to form a hydrocarbon ring; and R represents a group cleavable by an action of an acid. By containing this resin as a component of a photoresist, rectangularity of the pattern shape is particularly improved.

DETAILED DESCRIPTION OF THE INVENTION

The photoresist in the present invention refers to a radiation-sensitive film material which is used for forming a fine pattern on a substrate through a process comprising steps of forming a thin film on the substrate, selectively irradiating the film with radiation (light exposure) and developing the irradiated films. The photoresist contains a resin component as a binder and a radiation-sensitive component or contains a resin having a radiation-sensitive group itself. The photoresist includes a positive photoresist wherein the radiation-exposed portion is dissolved in a developer and the unexposed portion is remained as a pattern, and a negative photoresist wherein the radiation-unexposed portion is dissolved in a developer and the exposed portion is remained as a pattern. Although the resin having the respective structural units represented by the above formulas (I), (II) and (III) can be applied to both of them, this resin is particularly effective as a binder resin of a so-called chemical amplification type photoresist which contains an acid generator and utilizes a catalytic action of an acid generated from the acid generator at the radiation-exposed portion.

The chemical amplification type photoresist contains a resin component and an acid generator and is capable of generating an acid from the acid generator at the radiation-exposed portion, and a catalytic action of the acid is utilized. In the case of the chemical amplification type positive photoresist, an acid generated at the radiation-exposed portion is diffused by the subsequent heat treatment (post exposure bake: hereinafter abbreviated to PEB, sometimes) to eliminate a protective group of the resin and to reproduce an acid, thereby making the radiation-exposed portion alkali-soluble. The chemical amplification type positive photoresist includes:

1) a photoresist which contains a dissolution inhibitor having a protective group capable of cleaving by an action of an acid, in addition to an alkali-soluble resin component and an acid generator, wherein said dissolution inhibitor itself has a dissolution inhibition ability to an alkali-soluble resin but loses the ability, that is, the alkali-soluble resin restores its alkali-solublility, after the above protective group was cleaved by the action of the acid, and 2) a photoresist wherein a resin component has a protective group capable of cleaving by the action of the acid and the resin component itself is insoluble or slightly soluble in an alkali but becomes alkali-soluble after the above protective group was cleaved by the action of the acid.

Regarding the chemical amplification type negative photoresist, the resin components are usually alkali-soluble and the photoresist contains acrosslinking agent, in addition to this resin component and acid generator. In the chemical amplification negative photoresist, the acid generated at the radiation-exposed portion is diffused by PEB to act on the crosslinking agent, thereby curing the binder resin of the radiation-exposed portion. Examples of the chemical amplification type positive or negative photoresist include a photoresist wherein a group corresponding to the acid generator, that is, a group cleavable by the action of light to generate an acid, is bonded to the side chain of the resin.

The resin having the respective structural units represented by the above formulas (I), (II) and (III) has a dissolution inhibition ability to the alkali developer particularly by the presence of the structural unit of formula (III) and the group R therein is cleaved by the action of the acid. When the amount of this structural unit of formula (III) is comparatively increased, the resin itself is insoluble or slightly soluble in an alkali but becomes alkali-soluble after the group R in the formula (III) was cleaved by the action of the acid. Accordingly, this resin is particularly useful as the resin component of the chemical amplification type positive photoresist composition.

The position of a hydroxyl group in the formula (I), a group —OC(=O)CR$^{14}$R$^{15}$R$^{16}$ in the formula (II) and a group —OR in the formula (III) on the benzene ring is arbitrary, but is generally a p-position to the position connected to the main polymer chain. In these formulas, R$^1$, R$^2$, R$^3$, R$^{11}$, R$^{12}$, R$^{13}$, R$^{21}$, R$^{22}$ and R$^{23}$ each represents a hydrogen or an alkyl having 1 to 4 carbon atoms, but each preferably represents hydrogen or methyl. Considering the raw material circumstances, it is advantageous that R$^1$, R$^2$, R$^{11}$, R$^{12}$, R$^{21}$ and R$^{22}$ represent hydrogen and R$^3$, R$^{13}$ and R$^{23}$ each represents hydrogen or methyl.

In the formula (II), one of R$^{14}$, R$^{15}$ and R$^{16}$ may represent an aliphatic hydrocarbon residue and the rest may each independently represent hydrogen or an aliphatic hydrocarbon residue. Examples of the aliphatic hydrocarbon residue includes alkyl, alkenyl, alkynyl or the like, but alkyl is generally advantageous. The number of carbon atoms of the aliphatic hydrocarbon residue may be comparatively large such as about 20, but is generally from about 1 to 4. Alternatively, two or three of R$^{14}$, R$^{15}$ and R$^{16}$ may be combined each other together with a carbon atom to which they are bonded to form a hydrocarbon ring. When such a ring is formed by R$^{14}$, R$^{15}$ and R$^{16}$ as well as the carbon atom to which they are bonded, a crosslinked polycylic ring is obtained. When such a ring is formed by two of R$^{14}$, R$^{15}$ and R$^{16}$ as well as the carbon atom to which they are bonded, a monocylic ring is obtained. The number of carbon atoms constituting the ring is from about 5 to 10. Among them, the case where two or three of R$^{14}$, R$^{15}$ and R$^{16}$ represent alkyl, particularly methyl, and the case where two of them are combined each other together with the carbon atom to which they are bonded to form a ring are advantageous. Specific examples of the group corresponding to —OC(=O) CR$^{14}$R$^{15}$R$^{16}$ include isobutyryl, pivaloyl, cyclohexanecarbonyl, cyclopentanelcarbonyl and the like.

In the formula (III), R is a group cleavable by the action of the acid. It can be various known protective groups which have a dissolution inhibition ability to an alkali developer but are unstable to the acid. Examples thereof include tert-butoxycarbonyl, tert-butoxycarbonylmethyl, 1-alkoxyalkyl such as 1-ethoxyethyl, 1-methoxyethyl, 1-propoxyethyl, 1-isopropoxyethyl, 1-tert-butoxyethyl, 1-isobutoxyethyl, 1-butoxyethyl, 1-pentyloxyethyl, 1-cyclopentyloxyethyl, 1-hexyloxyethyl, 1-cyclohexyloxyethyl, 1-heptyloxyethyl, 1-cycloheptyloxyethyl, 1-methoxypropyl, 1-ethoxypropyl and 1-methoxy-1-methylethyl, and 2-residue of cyclic saturated ether such as tetrahydro-2-pyranyl, 6-methoxytetrahydro-2-pyranyl, 6-ethoxytetrahydro-2-pyranyl, tetrahydro-2-furyl, 5-methoxytetrahydro-2-furyl and 5-ethoxytetra-2-furyl. Among these protective groups, 1-alkoxyalkyl group or 2-residue of cyclic saturated ether is particularly preferred. Such a preferred protective group R can be specifically represented by the following formula (IIIa):

(IIIa)

wherein R$^{24}$ represents hydrogen or an alkyl having 1 to 4 carbon atoms; R$^{25}$ represents an alkyl having 1 to 4 carbon atoms; and $R^{26}$ represents an alkyl or a cycloalkyl or $R^{25}$ and $R^{26}$ are combined each other to form an alkylene chain which may be substituted with an alkoxy.

In the formula (IIIa), when $R^{26}$ is an alkyl, the number of carbon atoms may be comparatively large such as about 20, but is generally from about 1 to 4, that is, a lower alkyl. When $R^{26}$ is a $C_3$ to $C_8$ cycloalkyl, examples thereof include cyclopentyl, cyclohexyl, cycloheptyl and the like. Examples of the alkylene chain formed by $R^{25}$ and $R^{26}$ include trimethylene and tetramethylene (each one is combined together with a carbon atom to which $R^{25}$ is bonded or an oxygen atom to which $R^{26}$ is bonded to form a tetrahydrofuran ring or a tetrahydropyran ring) as well as partially branched alkylene chain having about 4 to 10 carbon atoms. The alkylene chain may also be substituted with an alkoxy having about 1 to 4 carbon atoms, such as methoxy, ethoxy or the like. Preferred examples of the group represented by the formula (IIIa) includes those wherein $R^{24}$ is hydrogen and $R^{25}$ and $R^{26}$ are respectively an alkyl, for example, 1-ethoxyethyl, 1-ethoxypropyl or the like.

In the present invention, preferred proportion of the respective structural units represented by the formulas (I) (II) and (III) varies depending on the kind of the photoresist. Generally, the proportion of the structural unit represented by the formula (II) is selected within a range from 1 to 30% by mol and the proportion of the structural unit represented by the formula (III) is selected within a range from 10 to 70% by mol according to the kind of the photoresist. When using as the resin component of the chemical amplification type positive photoresist composition, preferred proportion of the structural unit of the formula (II) is within a range from about 2 to 20% by mol, more preferably not less than 5% by mol and not more than about 15% by mol, while preferred proportion of the structural unit of the formula (III) is within a range from about 15 to 50% by mol. When R in the formula (III) is a 1-alkoxyalkyl such as 1-ethoxyethyl, 1-ethoxypropyl or the like, preferred proportion of the structural unit of the formula (III) in the resin is not less than 15% by mol and not more than 40% by mol, more preferably not more than about 35% by mol. In this case, the total proportion of the structural unit of the formula (II) and the structural unit of the formula (III) is preferably not more than about 45% by mol based on the whole units of the resin.

The resin having the respective structural units of the above formulas (I), (II) and (III) can be obtained, for example, by copolymerizing the respective substituted styrene compounds represented by the following formulas (IV), (V) and (VI):

(IV)

(V)

(VI)

wherein $R^1$, $R^2$, $R^{11}$, $R^{12}$, $R^{13}$, $R^{14}$, $R^{15}$, $R^{16}$, $R^{21}$, $R^{22}$, $R^{23}$ and R are as defined above.

Alternatively, the resin can be produced by reacting polyvinylphenols having a structural unit represented by the formula (I) with an acid halide represented by the following formula (VII):

(VII)

wherein $R^{14}$, $R^{15}$ and $R^{16}$ are as defined above; and X represents a halogen, and a compound for leading to the group R in the formula (III) in an arbitrary order. Generally, this method is advantageous. When this method is employed, $R^{11}$ in the formula (II) and $R^{21}$ in the formula (III) are the same as $R^1$ in the formula (1). Similarly, $R^{12}$ and $R^{22}$ are the same as $R^2$, while $R^{13}$ and $R^{23}$ are the same as $R^3$.

The compound for leading to the group R in the above formula (III) is di-tert-butyl dicarbonate when R is tert-butoxycarbonyl, and is tert-butyl chloroacetate when R is tert-butoxycarbonylmethyl. When R is a group represented by the above formula (IIIa), it is an unsaturated ether compound of the following formula (VIII):

(VIII)

wherein $R^{24}$ is as defined above; $R^{26}$ represents an alkyl or a cycloalkyl; and $R^{27}$ and $R^{28}$ each independently represents hydrogen or an alkyl provided that the total number of carbon atoms of them is from 0 to 3; or $R^{26}$ and $R^{27}$ are combined each other to form an alkylene chain which may be substituted with an alkoxy.

Examples of the polyvinylphenols having a structural unit represented by the formula (I) include polyvinylphenol and polyisopropenylphenol. Examples of the acid halide represented by the formula (VII) includes isobutyryl chloride, pivaloyl chloride, cyclohexanecarbonyl chloride, cyclopentanecarbonyl chloride or the like.

The acid halide of the formula (VII) may be used in an amount required to convert the unit of the formula (I) constituting the polyvinylphenols into the unit of the formula (II). For example, when 1–30% of the hydroxyl group in the polyvinylphenols is converted into an ester in the formula (II), the acid halide of the formula (VII) may be used in the amount within a range from 0.01 to 0.3 equivalent based on the hydroxyl group in the polyvinylphenols. A very complicated operation is required to quantitatively determine the amount of the unit of the formula (II), specifically ester portion thereof. According to the results of a test, when the acid halide of the formula (VII) is reacted with the polyvinylphenols, they reacts nearly quantitatively if the amount of the acid halide is not so large. Therefore, it is possible to regard the amount of the acid halide charged as an amount conversed into the structural unit of the formula (II).

In the formula (VIII) representing the unsaturated ethers, the portion corresponding to $R^{27}R^{28}C=$ is added to a hydroxyl group in the polyvinylphenols to become an alkyl corresponding to the group $R^{25}$ in the formula (IIIa). In the formula (VIII), when $R^{26}$ and $R^{27}$ are combined to form analkylene chain, the total number of carbon atoms of this alkylene chain and $R^{28}$ in the same formula is smaller than those of the alkylene chain formed of $R^{25}$ and $R^{26}$ in the formula (IIIa) only by 1. Specific examples of the unsaturated ether compound represented by the formula (VIII) include ethyl vinyl ether, methyl vinyl ether, n-propyl vinyl ether, isopropyl vinyl ether, n-butyl vinyl ether, isobutyl vinyl ether, tert-butyl vinyl ether, sec-butyl vinyl ether, n-pentyl vinyl ether, cyclopentyl vinyl ether, n-hexyl vinyl ether, cyclohexyl vinyl ether, ethyl-1-propenyl ether, methyl-1-propenyl ether, methyl isopropenyl ether, ethyl-2-methyl-1-propenyl ether, 2,3-dihydrofuran, 3,4-dihydro-2H-pyran, 4,5-dihydro-2-methylfuran, 3,4-dihydro-2-methoxy-2H-pyran, 3,4-dihydro-2-ethoxy-2H-pyran and the like.

The unsaturated ether compound represented by the formula (VIII) may be used in an amount required to convert the unit of the formula (I) constituting the polyvinylphenols into the unit of the formula (IIIb):

(IIIb)

wherein $R^1$, $R^2$, $R^3$, $R^{14}$, $R^{15}$ and $R^{16}$ are as defined above. For example, when 10–50% by mol of the unit of the formula (I) constituting the polyvinylphenols is converted into the unit of the formula (IIIb), the unsaturated ether compound of the formula (VIII) may be used in an amount within a range from 0.1 to 0.5 equivalents or an amount larger slightly than the above range. Since this reaction does not proceeds quantitatively, necessarily, the incorporation rate of the group represented by the formula (IIIa) is decided by analysis.

The reaction between the polyvinylphenols and the acid halide can be conducted by dissolving the polyvinylphenols having a structural unit represented by the formula (I) into a suitable solvent and adding the acid halide of the formula (VII) in the presence of a basic catalyst.

Examples of the solvent used in this reaction includes glycol ether esters such as ethylcellosolve acetate, methylcellosolve acetate, propylene glycol monomethyl ether acetate and propylene glycol monoethyl ether; glycol mono- and diethers, such as ethylcellosolve, methylcellosolve, propylene glycol monomethyl ether, propylene glycol monoethyl ether and diethylene glycol dimethyl ether; ethers such as diethyl ether, tetrahydrofuran, 1,4-dioxane, 1,3-dioxolane and diisopropyl ether; esters such as methyl acetate, ethyl acetate, butyl acetate, isobutyl acetate, ethyl lactate, ethyl pyruvate, methyl propionate and ethyl propionate; ketones such as acetone, methyl ethyl ketone, 2-heptanone, cyclohexanone and methyl isobutyl ketone; and aromatic hydrocarbons such as xylene and toluene. The amount of the solvent is appropriately selected from a range of about 1 to 100 parts by weight per one part of the polyvinylphenols.

Examples of the basic catalyst include primary amines such as hexylamine, heptylamine, octylamine, nonylamine, decylamine, aniline, 2-, 3- and 4-methylaniline, 4-nitroaniline, 1-naphthylamine and 2-naphthylamine; secondary amines such as dibutylamine, dipentylamine, dihexylamine, diheptylamine, dioctylamine, dinonylamine, didecylamine, N-methylaniline, piperidine and diphenylamine; tertiary amines such as triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethyldipentylamine, ethyldihexylamine, ethyldiheptylamine, ethyldioctylamine, ethyldinonylamine, ethyldidecylamine, tris[2-(2-methoxyethoxy)ethyl]amine, triisopropanolamine and N,N-dimethylaniline; diamines such as ethylenediamine, tetramethylenediamine and hexamethylenediamine; and unsaturated cyclic amines such as imidazole, pyridine, 4-methylpyridine, 4-methylimidazole and bipyridine. The amount of the basic catalyst is selected from a range of about 1 to 100 mol per mol of the acid halide.

This reaction can proceed under a normal pressure, but may also be conducted under a reduced pressure or an elevated pressure. This reaction is usually conducted at a temperature lower than a boiling point of the solvent and acid halide for about 1 to 96 hours. A resin having the structural units of the formulas (I) and (II) is obtained as a solution by subjecting the reaction product to a normal post-treatment operation such as extraction, crystallization or the like after the completion of the reaction. Alternatively, the resin can be isolated as a solid after the completion of the reaction.

Furthermore, the reaction between the polyvinylphenols and the unsaturated ether compound represented by the above formula (VIII) can be conducted in a suitable solvent in the presence of an acid catalyst. In this reaction, the same solvent as shown in the reaction with the above acid halide can also be used. The amount of the solvent is appropriately selected from a range of about 1 to 100 parts by weight per a part of the raw resin.

Examples of the acid catalyst used in this reaction includes inorganic acids such as hydrochloric acid and sulfuric acid; amine salt of inorganic acids, such as triethylamine hydrochloride and pyridine hydrochloride; organic carboxylic acids such as oxalic acid; organic sulfonic acids such as p-toluenesulfonic acid, camphorsulfonic acid, n-propanesulfonic acid and n-butanesulfonic acid; and amine salt of organic acids, such as pyridine p-toluenesulfonate salt and triethylamine p-toluenesulfonate salt. The amount of the acid catalyst is selected from a range of about 0.001 to 100% by mol based on the unsaturated ether compound of the formula (VIII).

This reaction can proceed under a normal pressure, but can also be conducted under a reduced pressure or an elevated pressure. This reaction is usually conducted at a temperature lower than a boiling point of the unsaturated ether compound for about 1 to 96 hours. A resin wherein a portion of the unit of the formula (I) is converted into the unit of the formula (IIIb) is obtained as a solution by subjecting the reaction product to a normal post-treatment operation such as extraction, crystallization or the like after the completion of the reaction. Alternatively, the resin can be isolated as a solid after the completion of the reaction.

The resin having the respective structural units represented by the formulas (I), (II) and (III) can be obtained by the reaction between the polyvinylphenols and the acid halide represented by the formula (VII) and the reaction with the compound for leading to the group R in the formula (III) such as an unsaturated ether represented by the formula (VIII), in an arbitrary order. It is generally advantageous that the polyvinylphenols are first reacted with the acid halide represented by the formula (VII) and then reacted with the compound for leading to the group R in the formula (III).

According to the method explained above, a resin wherein the unit represented by the formula (II) and the unit represented by the formula (III) are incorporated in an arbitrary proportion can be obtained. The resin thus obtained can be used as it as the resin component of the photoresist. The protective group incorporation proportion can be adjusted by preparing a plurality of resins wherein one or both of the incorporation proportion of the unit represented by the formula (II) and that of the unit representedby the formula (III) are different and mixing them. In the latter case, it is advantageous to use those having a comparatively close protective group incorporation proportion in combination. The resin thus obtained can be used alone as the resin component of the photoresist, or can also be used in combination with the other resin, wherein the amount of the resin thus obtained is preferably not less than 50% by weight based on the whole resin component constituting the photoresist.

Examples of the other resin, which can he used in the present invention, include various alkali-soluble resins, and resins wherein a phenolic hydroxyl group has a dissolution inhibition ability to an alkali developer and is partially protected with a group which is unstable to the acid. Examples of the alkali-soluble resin include novolak resin; polyvinylphenol resin; polyisopropenylphenol resin; copolymers of vinyl phenol and acrylic acid, methacrylic acid, acrylonitrile, methyl methacrylate, methyl acrylate, maleic acid, maleic anhydride, isopropenylphenol, styrene or α-methylstyrene; and copolymers of isopropenylphenol and acrylic acid, methacrylic acid, acrylonitrile, methyl methacrylate, maleic acid, maleic anhydride, styrene or α-methylstyrene. These resins may also be partially hydrogenated to improve transparency. As far as the resulting resin is soluble in an alkali, an alkyl, an alkoxy or the like may also be incorporated into a phenol nucleus. The group for protecting the phenolic hydroxyl group of these alkali-soluble resins can be various groups same to those exemplified above as R in the formula (III).

A chemical amplification type photoresist usually comprises an acid generator in addition to the resin described above. This acid generator can be various compounds capable of generating an acid by exposing the substance itself or a resist composition containing the substance to radiation. It can also be used as a mixture of two or more compounds. Examples thereof include onium salt, organohalogen compound, compound having a diazomethanedisulfonyl skeleton, disulfone compound, ortho-quinonediazide compound, sulfonic acid compound and the like. Examples of the onium salt includes iodonium salt, sulfonium salt or the like. Examples of the anion constituting these onium salts include p-toluenesulfonate ion (p-$CH_3C_6H_4SO_4^-$), trifluoromethanesulfonate ion ($CF_3SO_3^-$), tetrafluoroborate ion ($BF_4^-$), hexafluorophosphate ion ($PF_6^-$), hexafluoroantimonate ion ($SbF_6^-$) or the like. Various haloalkyltriazine compounds are included in the organohalogen compound. The compound having a diazomethanedisulfonyl skeleton is a compound wherein diazomethane is substituted with two of arylsulfonyl, alkylsulfonyl, cycloalkylsulfonyl, etc. The disulfone compound is a compound having —$SO_2SO_2$—. Example of the ortho-quinonediazide compound includes 1,2-benzoquinonediazide-(2)-4-sulfonate ester, 1,2-naphthoquinonediazide-(2)-4- or -5-sulfonate ester. Examples of the sulfonic acid compound include ester of alkylsulfonic acid, ester of haloalkylsulfonic acid, ester of arylsulfonic acid, ester of camphorsulfonic acid or the like, and examples of the alcohol component constituting these esters includes pyrogal, 2- or 4-nitrobenzyl alcohol, 2,6-dinitrobenzyl alcohol, N-hydroxyimide compound, oxime compound or the like. In the present invention, the onium salt, compound having a diazomethanedisulfonyl skeleton, disulfon compound, sulfonic acid compound or the like are preferably used as the acid generator.

Specific examples of the onium salt as the acid generator include p-tolyldiphenylsulfonium p-toluenesulfonate, p-tolyldiphenylsulfonium trifluoromethanesulfonate and the like. Specific examples of the compound having a diaz-omethanedisulfonyl skeleton include bis(cyclohexylsulfonyl)diazomethane, bis(phenylsulfonyl) diazomethane, bis(p-tolylsulfonyl)diazomethane, bis(2,4-xylylsulfonyl)diazomethane and the like. Specific examples of the disulfone compound include diphenyl disulfone, di-p-tolyl disulfone, phenyl p-tolyl disulfone, phenyl p-methoxyphenyl disulfone and the like. Specific examples of the sulfonic acid compound include N-(phenylsulfonyloxy)succinimide, N-(methylsulfonyloxy) succinimide, N-(trifluoromethylsulfonyloxy)succinimide, N-(butylsulfonyloxy)succinimide, N-(10-camphorsulfonyloxy)succinimide, N-(trifluoromethylsulfonyloxy)phthalimide, N-(trifluoromethylsulfonyloxy)naphthalimide, 2-nitrobenzyl p-toluenesulfonate, 4-nitrobenzyl p-toluenesulfonate, 2,6-nitrobenzyl p-toluenesulfonate, 1,2,3-benzenetoluyl p-toluenesulfonate, 1-benzoyl-1-phenylmethyl p-toluenesulfonate (commonly called name: benzoin tosylate), 2-benzoyl-2-hydroxy-2-phenylethyl p-toluenesulfonate (commonly called name: α-methylolbenzoin tosylate), α-(p-tolylsulfonyloxyimino)-4-methoxyphenylacetonitrile and the like.

Among them, the compound having a diazomethanedisulfonyl skeleton, particularly bis(cycloalkylsulfonyl) diazomethane such as bis(cyclohexylsulfonyl)diazomethane is preferably used because a photoresist composition containing it as the acid generator exhibits good resolution and affords a nearly rectangular profile. On the other hand, the onium salt such as p-tolyldiphenyl sulfonium p-toluenesulfonate is cleaved by the action of radiation to generate a strong acids such as p-toluenesulfonic acid, thereby making it possible to enhance the sensitivity of the photoresist composition. Therefore, it is also preferable.

In the chemical amplification type positive photoresist, it is known that the performance deteriorated by deactivation of the acid allowed to stand after light exposure can be improved generally by adding an organic base compound as a quencher. In the present invention, it is also preferred to formulate such an organic base compound. Specific examples of the organic base compound used herein include primary amines such as hexylamine, heptylamine, octylamine, nonylamine, decylamine, aniline, 2-, 3- and 4-methylaniline, 4-nitroaniline, 1-naphthylamine and 2-naphthylamine; secondary amines such as dibutylamine, dipentylamine, dihexylamine, diheptylamine, dioctylamine, dinonylamine, didecylamine, N-methylaniline, piperidine and diphenylamine; tertiary amines such as triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethyldipentylamine, ethyldihexylamine, ethyldiheptylamine, ethyldioctylamine, ethyldinonylamine, ethyldidecylamine, tris[2-(2-methoxyethoxy)ethyl]amine, triisopropanolamine and N,N-dimethylaniline; quaternary ammonium salts such as tetrabutylammonium hydroxide; diamines such as ethylenediamine, tetramethylenediamine and hexamethylenediamine; and unsaturated cyclic amines such as imidazole, pyridine, 4-methylpyridine, 4-methylimidazole and bipyridine. These organic base compounds can be used alone, or in combination of two or more kinds of them. In the present invention, use of the tertiary amine is particularly preferred. Among these organic base compounds, an organic base compound is preferred which is not evaporated at the prebaking temperature so that it is remained even after prebaking of the resist film formed on the substrate to exert the effect, e.g. those having a boiling point of not less than 150° C.

In the present invention, for the chemical amplification type positive photoresist composition made by formulating the acid generator together with the resin component, an amount of the resin component is preferably from 50 to 98% by weight, more preferably from 75 to 98% by weight, and an amount of the acid generator is preferably from 0.05 to 20% by weight, more preferably from 0.2 to 20%, by weight based on the total solid content in this composition. When the organic base compound is formulated as the quencher, it is preferably used in an amount within a range from 0.001 to 10% by weight based on the total solid content. The roughness of the profile can be improved, the focus margin can be widen and the resolution can be improved, by adjusting the amount of this quencher to a higher value within the above range. Such an effect becomes remarkable when the amount of the quencher is adjusted to 0.2% by weight or higher based on the total solid content in the composition.

On the other hand, when the amount of the quencher is increased, the acid generated by the action of radiation is trapped by the quencher and the sensitivity is often lowered. When using a compound having a diazomethanedisulfonyl ketone such as bis(cycloalkylsulfonyl)diazomethane as the acid generator, it is effective to use an onium salt such as p-tolyldiphenylsulfonium p-toluenesulfonate, p-tolyldiphenylsulfonium trifluorosulfonate, etc. in combination as the other acid generator in order to improve the sensitivity. Thus, by using the compound having a diazomethanedisulfonyl skeleton and onium salt in combination and by increasing the amount of the quencher, an improvement in roughness, an improvement in resolution and an increase in focus margin can be accomplished and, furthermore, a reduction in sensitivity can also be inhibited. When using these two acid generators in combination, it is preferred to adjust a weight ratio of the compound having a diazomethanedisulfonyl skeleton to the onium salt within a range from about 100:1–50.

If necessary, the photoresist composition of the present invention can contain various additives commonly used in this field, such as dissolution inhibitors, sensitizers, dyes, adhesion modifiers, substrate dependence modifiers, water retaining agents and the like. Sometimes, the portion to be removed may be remained thinly on the substrate depending on the kind of the substrate on which the resist is coated, and such a retention of the thin film can be adjusted by formulating a small amount of a substrate dependence modifier such as succinimide. Since the presence of water is required to generate the acid in the chemical amplification type photoresist, the acid can be effectively generated by adding the water retaining agent. When using these additives, the total mount of them is less than about 20% by weight based on the total solid content in the composition.

The above respective components are mixed with the solvent so that the concentration of the total solid content is within a range from 10 to 50% by weight to prepare a resist solution, which is coated on the substrate such as silicon wafer. The solvent used herein may be any one capable of dissolving the respective components and can be those which are conventionally used in this field. Examples thereof include glycol ether esters such as ethylcellosolve acetate, methylcellusolve acetate, propylene glycol monomethyl ether acetate and propylene glycol monoethyl ether; glycol mono- and diethers, such as ethylcellosolve, methylcellosolve, propylene glycol monomethyl ether, propylene glycol monoethyl ether and diethylene glycol dimethyl ether; esters such as ethyl lactate, butyl acetate and ethyl pyruvate; ketones such as 2-heptanone, cyclohexanone and methyl isobutyl ketone; lactones such as γ-butyrolactone; and aromatic hydrocarbons such as xylene. These solvents can be used alone or two or more kinds of them can be used in combination.

From the resist film coated on the substrate, a pattern is usually formed through the respective steps such as prebaking, patterning exposure, PEB and development using an alkali developer.

The following Examples further illustrate the present invention in detail but are not to be construed to limit the scope thereof. In the Examples, percentages and parts, which represent the content or amount, are by weight unless otherwise stated.

SYNTHESIS EXAMPLE 1

(1a) Partial Pivaloylation of Polyvinylphenol

In a flask, 100 g (0.83 mol as a p-vinylphenol unit) of poly(p-vinylphenol) and 1.2 kg of propylene glycol monomethyl ether acetate were charged and stirred to dissolve the resin. After the completion of the dissolution, 524 g of the solvent was distilled off by vacuum distillation under the conditions of a temperature of 60° C. and a pressure of 20 Torr. To this resin solution, 12.6 g (0.12 mol, 0.15 equivalents based on hydroxyl group of poly(p-vinylphenol)) of triethylamine was added. After the solution was heated to 50° C., 10.4 g (0.083 mol, 0.1 equivalent based on hydroxyl group of poly(p-vinylphenol)) of pivaloyl chloride was added dropwise. After stirring at 50° C. for 3 hours, 224 g of propylene glycol monomethyl ether acetate, 800 g of methyl isobutyl ketone and 608 g of an aqueous 0.5% oxalic acid solution were added and a phase separation of the resulting solution was conducted. The phase separation after adding 608 g of an aqueous 0.5% oxalic solution to this organic layer was conducted twice, followed by washing. Furthermore, the resulting organic layer was washed three times with 608 g of deionized water and a phase separation was conducted. The organic layer was concentrated by distilled off the solvent to obtain 388 g of a resin solution.

The concentration of the solid content of this resin solution was determined by an evaporation to dryness, and it was 29.3%. About 10% of the hydroxyl group of poly(p-vinylphenol) of this resin is converted into pivaloyl.

(1b) Partial 1-ethoxyethylation of Partially Pivaloylated Polyvinylphenol

In a flask, 85.2 g (0.19 mol as original p-vinylphenol unit) of the resin solution obtained in the above (1a), 0.023 g of p-toluenesulfonic acid monohydrate and 315 g of propylene glycol monomethyl ether acetate were charged, stirred and then concentrated under the conditions of a temperature of 65° C. and a reduced pressure of 20 Torr. After 159 g of the resin solution obtained by concentration was cooled to 20° C., 5.9 g (0.082 mol, 0.42 equivalents based on hydroxyl group of poly(p-vinylphenol)) of ethylvinylether was added dropwise over 10 minutes using a dropping funnel. After stirring at 25° C. for 3 hours, 141 g of methyl isobutyl ketone, 47 g of propylene glycol monomethyl ether acetate and 118 g of deionized water were added and a phase separation of the resultingsolutionwas conducted. The phase separation after washing the resulting organic layer with 118 g of deionized water was repeated three times. After the organic layer was concentrated by distilled off the solvent, the residue was solvent-substituted by adding 137 g of propyleneglycol monomethyl ether acetate and further distilling off the solvent to obtain 91 g of a propylene glycol monomethyl ether acetate solution of the resin.

The concentration of the solid content of this resin solution was determined by an evaporation to dryness, and it was 28.7%. In addition, the proportion of the 1-ethoxyethylated group out of the hydroxyl group in poly(p-vinylphenol) was determined by using a nuclear magnetic resonance (NMR) spectrometer. It was 36.9%.

(1c) Partial 1-ethoxyethylation of Partially Pivaloylated Polyvinylphenol In a flask, 85.2 g (0.19 mol as original p-vinylphenol unit) of the resin solution obtained in the above (1a), 0.013 g of p-toluenesulfonic acid monohydrate and 315 g of propylene glycol monomethyl ether acetate were charged, stirred and then concentrated under the conditions of a temperature of 65° C. and a reduced pressure of 20 Torr. After 157 g of the resin solution obtained by concentration was cooled to 20° C., 3.2 g (0.045 mol, 0.23 equivalents based on hydroxyl group of poly(p-vinylphenol)) of ethylvinylether was added dropwise over 10 minutes using a dropping funnel. After stirring at 25° C. for 3 hours, 138 g of methyl isobutyl ketone, 46 g of propylene glycol monomethyl ether acetate and 115 g of deionized water were added, and a phase separation of the solution was conducted. The phase separation after washing the resulting organic layer with 115 g of deionized water was repeated three times. After the organic layer was concentrated by distilled off the solvent, the residue was solvent-substituted by adding 156 g of propyleneglycol monomethyl ether acetate and further distilling off the solvent to obtain 85 g of a propylene glycol monomethyl ether acetate solution of the resin.

The concentration of the solid content of this resin solution was determined by an evaporation to dryness, and it was 30.6%. In addition, the proportion of the 1-ethoxyethylated group out of the hydroxyl group in poly(p-vinylphenol) was determined by using a NMR spectrometer. It was 20.8%.

(1d) Adjustment of 1-ethoxyethylation Percentage 2.61 g of the resin solution obtained in the above (1b) and 7.39 g of the resin solution obtained in the above (1c) were mixed to obtain 10 g of a resin solution corresponding to the solid content concentration of 30.1%. This resin is composed of each structural unit of the following formula, wherein the pivaloylation percentage of the hydroxyl group in poly(p-vinylphenol) is about 10% and the 1-ethoxyethylation percentage of the hydroxyl group is about 25%. This resin is referred to as a resin R1.

SYNTHESIS EXAMPLE 2

(2a) Partial Cyclohexanecalboxylation of Polyvinylphenol

In a flask, 100 g (0.83 mol as a p-vinylphenol unit) of poly(p-vinylphenol) and 1.2 kg of propylene glycol monomethyl ether acetate were charged and stirred to dissolve the resin. After the completion of the dissolution, 467 g of the solvent was distilled off by vacuum distillation under the conditions of a temperature of 60° C. and a pressure of 20 Torr. To this resin solution, 12.6 g (0.12 mol, 0.15 equivalents based on hydroxyl group of poly(p-vinylphenol)) of triethylamine was added. After the solution was heated to 50° C., 12.2 g (0.083 mol, 0.1 equivalent based on hydroxyl group of poly(p-vinylphenol)) of cyclohexanecarbonyl chloride was added dropwise. After stirring at 50° C. for 3 hours, 167 g of propylene glycol monomethyl ether acetate, 800 g of methyl isobutyl ketone and 608 g of an aqueous 0.5% oxalic acid solution were added and a phase separation of the resulting solution was conducted. The phase separation after adding 608 g of an aqueous 0.5% oxalic solution to this organic layer was conducted twice, followed by washing.

Furthermore, the resulting organic layer was washed three times with 608 g of deionized water and a phase separation was conducted. The organic layer was concentrated by distilled off the solvent to obtain 379 g of a resin solution.

The concentration of the solid content of this resin solution was determined by an evaporation to dryness, and it was 29.9%. About 10% of the hydroxyl group of poly(p-vinylphenol) of this resin is converted into cyclohexanecarbonyl.

(2b) Partial 1-ethoxyethylation of Partially Cyclohexanecarbonylated Polyvinylphenol In a flask, 83.8 g (0.19 mol as original p-vinylphenol unit) of the resin solution obtained in the above (2a), 0.023 g of p-toluenesulfonic acid monohydrate and 316 g of propylene glycolmonomethyl ether acetate were charged, stirred and then concentrated under the conditions of a temperature of 65° C. and a reduced pressure of 20 Torr. After 151 g of the resin solution obtained by concentration was cooled to 20° C., 5.8 g (0.08 mol, 0.42 equivalents based on hydroxyl group of poly(p-vinylphenol)) of ethylvinylether was added dropwise over 10 minutes using a dropping funnel. After stirring at 25° C. for 3 hours, 141 g of methyl isobutyl ketone, 55 g of propylene glycol monomethyl ether acetate and 118 g of deionized water were added and a phase separation of the resulting solution was conducted. The phase separation after washing the resulting organic layer with 118 g of deionized water was repeated three times. After the organic layer was concentrated by distilled off the solvent, the residue was solvent-substituted by adding 122 g of propyleneglycol monomethyl ether acetate and further distilling off the solvent to obtain 87 g of a propylene glycol monomethyl ether acetate solution of the resin.

The concentration of the solid content of this resin solution was determined by an evaporation to dryness, and it was 30.7%. In addition, the proportion of the 1-ethoxyethylated group out of the hydroxyl group in poly(p-vinylphenol) was determined by using a nuclear magnetic resonance (NMR) spectrometer. It was 36.8%.

(2c) Other Partial 1-ethoxyethylati on of Partially Cyclohexanecarbonylated Polyvinyephenol In a flask, 83.8 g (0.19 mol as original p-vinylphenol unit) of the resin solution obtained in the above (2a), 0.012 g of p-toluenesulfonic acid monohydrate and 316 g of propylene glycol monomethyl ether acetate were charged, stirred and then concentrated under the conditions of a temperature of 65° C. and a reduced pressure of 20 Torr. After 157 g of the resin solution obtained by concentration was cooled to 20° C., 3.2 g (0.044 mol, 0.23 equivalents based on hydroxyl group of poly(p-vinylphenol)) of ethylvinylether was added dropwise over 10 minutes using a dropping funnel. After stirring at 25° C. for 3 hours, 138 g of methyl isobutyl ketone, 32 g of propylene glycol monomethyl ether acetate and 115 g of deionized water was added, and a phase separation of the solution was conducted. The phase separation after washing the resulting organic layer with 115 g of deionized water was repeated three times. After the organic layer was concentrated by distilled off the solvent, the residue was solvent-substituted by adding 95 g of propyleneglycol monomethyl ether acetate and further distilling off the solvent to obtain 92 g of a propylene glycol monomethyl ether acetate solution of the resin.

The concentration of the solid content of this resin solution was determined by an evaporation to dryness, and it was 28.0%. In addition, the proportion of the 1-ethoxyethylated group out of the hydroxyl group in poly(p-vinylphenol) was determined by using a NMR spectrometer. It was 18.3%.

(2d) Adjustment of 1-ethoxyethylation Percentage 3.62 g of the resin solution obtained in the above (2b) and 6.38 g of the resin solution obtained in the above (2c) were mixed to obtain 10 g of a resin solution corresponding to the solid content concentration of 29.0%. This resin is composed of each structural unit of the following formula, wherein the cyclohexanecarbonylation percentage of the hydroxyl group in poly(p-vinylphenol) is about 10% and the 1-ethoxyethylation percentage of the hydroxyl group is about 25%. This resin is referred to as a resin R2.

SYNTHESIS EXAMPLE 3

(3a) Partial 1-ethoxyethylation of Polyvinylphenol

In a flask, 40.0 g (0.33 mol as an p-vinylphenol unit) of poly(p-vinylphenol), 0.052 g of p-toluenesulfonic acid monohydrate and 480 g of propylene glycol monomethyl ether acetate were charged, stirred and then concentrated under the conditions of a temperature of 65° C. and a reduced pressure of 20 Torr. After 194 g of the resin solution obtained by concentration was cooled to 20° C., 13.2 g (0.18 mol, 0.55 equivalents based on hydroxyl group of poly(p-vinylphenol)) was added dropwise over 10 minutes using a dropping funnel. After stirring at 25° C. for 3 hours, 320 g of methyl isobutyl ketone, 87 g of propylene glycol monomethyl ether acetate and 200 g of deionized water were added and a phase separation of the resulting solution was conducted. The phase separation after washing the resulting organic layer with 200 g of deionized water was repeated three times. After the organic layer was concentrated by distilled off the solvent, the residue was solvent-substituted by adding 330 g of propyleneglycol monomethyl ether acetate and further distilling off the solvent to obtain 158 g of a propylene glycol monomethyl ether acetate solution of the resin.

The concentration of the solid content of this resin solution was determined by an evaporation to dryness, and it was 30.0%. In addition, the proportion of the 1-ethoxyethylated group out of the hydroxyl group in poly(p-vinylphenol) was determined by using a nuclear magnetic resonance (NMR) spectrometer. It was 41.6 %. This resin is referred to as a resin RX1.

(3b) Partial 1-ethoxyethylation of Polyvinylphenol

In a flask, 40.0 g (0.33 mol as p-vinylphenol unit) of poly(p-vinylphenol), 0.033 g of p-toluenesulfonic acid monohydrate and 480 g of propylene glycol monomethyl ether acetate were charged, stirred and then concentrated under the conditions of a temperature of 65° C. and a reduced pressure of 20 Torr. After 152 g of the resin solution obtained by concentration was cooled to 20° C., 8.4 g (0.12 mol, 0.35 equivalents based on hydroxyl group of poly(p-vinylphenol)) of ethylvinylether was added dropwise over 10 minutes using a dropping funnel. After stirring at 25° C. for 3 hours, 320 g of methyl isobutyl ketone, 128 g of propylene glycol monomethyl ether acetate and 200 g of deionized water was added, and a phase separation of the solution was conducted. The phase separation after washing the resulting organic layer with 200 g of deionized water was repeated three times. After the organic layer was concentrated by distilled off the solvent, the residue was solvent-substituted by adding 300 g of propyleneglycol monomethyl ether acetate and further distilling off the solvent to obtain 159 g of a propylene glycol monomethyl ether acetate solution of the resin.

The concentration of the solid content of this resin solution was determined by an evaporation to dryness, and it was 27.6 %. In addition, the proportion of the 1-ethoxyethylated group out of the hydroxyl group in poly(p-vinylphenol) was determined by using a NMR spectrometer. It was 21.9%. This resin is referred to as a resin RX2.

(3c) Adjustment of 1-ethoxyethylation Percentage 6.65 g of the resin RX1 solution obtained in the above (3a) and 3.35 g of the resin RX2 solution obtained in the above (3b) were mixed to obtain 10 g of a resin solution corresponding to the solid content concentration of 29.2%. This resin is composed of each structural unit of the following formula, wherein the 1-ethoxyethylation percentage of the hydroxyl group is about 35%. This resin is referred to as a resin RX.

EXAMPLE 1

13.5 Parts (calculated on the solid basis of the resin) of a propylene glycol monomethyl ether acetate solution of the resin R1 obtained in (1d) of Synthesis Example 1, 0.5 parts of bis(cyclohexylsulfonyl)diazomethane as an acid generator, 0.02 parts of methyldioctylamine and propylene glycol monomethyl ether acetate were mixed and dissolved so that the total amount of propylene glycol monomethyl ether acetate becomes 69 parts. This solution was filtered through a fluororesin filter having a pore diameter of 0.1 $\mu$m to prepare a resist solution.

Using a spin coater, the above solution was coated on a silicon wafer washed by a conventional method so that the film thickness after drying becomes 0.72 $\mu$m. Then, this silicon wafer was prebaked on a hot plate at 90° C. for 90 seconds. The coated film after prebaking was exposed to light through a chromium mask having a pattern while changing a dosage in steps, using a KrF excimer laser stepper having an exposure wavelength of 248 nm ["NSR-1755 EX8A" manufactured by Nicon Corp., NA=0.45]. The wafer after light exposure was heated on a hot plate at 100° C. for 90 seconds, thereby performing PEB, and then the deblocking reaction of the exposed portion was conducted. The reaction product was developed with an aqueous 2.38% solution of tetramethylammonium hydroxide to obtain a positive pattern.

The formed pattern was observed by an electron microscope. A fine pattern of 0.24 $\mu$m was resolved with good profile at a dosage of 76 mJ/cm$^2$. This pattern had no round top and was almost rectangular. 76 mJ/cm$^2$ corresponds to the dosage (effective sensitivity) at which a line and space pattern of 0.25 $\mu$m becomes 1:1, while 0.24 $\mu$m corresponds to a minimum size (resolution) of the line and space separated at the dosage of the effective sensitivity.

EXAMPLE 2

The same test as in Example 1 was conducted, except for using a propylene glycol monomethyl ether acetate solution of the resin R2 obtained in (2d) of Synthesis Example 2 in place of the solution of the resin R1 used in Example 1. As a result, a fine pattern of 0.24 $\mu$m was resolved with good profile at a dosage of 86 mJ/cm$^2$. This pattern had also no round top and was almost rectangular.

COMPARATIVE EXAMPLE 1

The same test as in Example 1 was conducted, except for using a propylene glycol monomethyl ether acetate solution of the resin RX obtained in (3c) of Synthesis Example 3 in place of the solution of the resin R1 used in Example 1. As a result, a fine pattern of 0.24 $\mu$m was resolved at a dosage of 63 mJ/cm$^2$. However, this pattern had a round top and the profile was not good.

SYNTHESIS EXAMPLE 4

(4a) Partial Pivaloylation of Polyvinylphenol

In a round bottom flask wherein the atmosphere is replaced by nitrogen for 10 minutes, 1.3 kg (10.82 mol as p-vinylphenol unit) of poly(p-vinylphenol) and 5.2 kg of acetone were charged and stirred to dissolve the resin. Then, 164.2 g (1.623 mol) of triethylamine was added and the solution was heated to 35–40° C. To this resin solution, 130.5 g (1.082 mol, 0.1 equivalent based on hydroxyl group of poly(p-vinylphenol)) of pivaloyl chloride was added dropwise over about 10 minutes. After stirring at 40° C. for about 3 hours, 10.4 kg of methyl isobutyl ketone was added and the solution was washed with an aqueous 0.5% oxalic solution three times. A phase separation after washing the resulting organic layer with deionized water was conducted five times. The organic layer was concentrated by distilled off the solvent to obtain 4.994 kg of a resin solution.

The concentration of the solid content of this resin solution was determined by an evaporation to dryness, and it was 27.5%. About 10% of the hydroxyl group of poly(p-vinylphenol) in this resin is converted into a pivaloyl ester.

(4b) Partial 1-ethoxyethylation of Partially Pivaloylated Polyvinylphenol

In a flask wherein the atmosphere is replaced by nitrogen for 10 minutes, 150g (0.32 mol as original p-vinylphenol unit) of the resin solution obtained in the above (4a), 138.7 g of methyl isobutyl ketone and 0.012 g of p-toluenesulfonic acid monohydrate were charged and stirred. After the temperature of this solution was adjusted to about 20° C., 7.5 g (0.104 mol) of ethylvinylether was added dropwise over about 10 minutes using a dropping funnel. After the solution was stirred with maintaining at 25° C. or lower for about 3 hours, 165 g of methyl isobutyl ketone was added. Then, a phase separation after washing the resulting organic layer with deionized water was conducted four times. After this organic layer was concentrated by distilling off the solvent, propylene glycol monomethyl ether acetate of three times weight of the solution after concentration was added. Then, methyl isobutyl ketone was distilled off by azetropic distillation to obtain 167.5 g of a propylene glycol monomethyl ether acetate solution of the resin.

The concentration of the solid content of this resin solution was determined by an evaporation to dryness, and it was 28.7%. In addition, the proportion of the 1-ethoxyethylated group out of the hydroxyl group in poly(p-vinylphenol) was determined by using a NMR spectrometer. As a result, it was 22.3%. This resin is referred to as a resin R41.

(4c) Other Partial 1-ethoxyethylation of Partially Pivaloylated Polyvinylphenol

The same operation as in the above (4b) was conducted, except for changing the amount of ethyl vinyl ether used; when the amount of the resin solution obtained in (4a) used was changed, the amount of the other raw materials and that of the solvent, so that their proportions unchanged; and the stirring time after the addition of ethyl vinyl ether appropriately. The solid content concentration of the resulting solution, and the 1-ethoxyethylation percentage of the hydroxyl group in poly(p-vinylphenol) in each resin are shown in Table 1, together with the values of the resin R41 obtained in the above (4b).

TABLE 1

| Name of resin | Concentration of solid content | Pivaloylation percentage (based on charged amount) | 1-ethoxyethylation percentage (measured value) |
|---|---|---|---|
| R41 | 28.7% | 10% | 22.8% |
| R42 | 28.7% | 10% | 26.5% |
| R43 | 31.6% | 10% | 35.7% |
| R44 | 27.8% | 10% | 40.5% |
| R45 | 29.9% | 10% | 18.0% |
| R46 | 32.1% | 10% | 13.2% |
| R47 | 30.4% | 10% | 11.4% |
| R48 | 25.0% | 10% | 27.9% |
| R49 | 30.8% | 10% | 16.2% |

EXAMPLE 3

The respective solutions of the resins R41 to R47 obtained in (4b) or (4c) of Synthesis Example 4 were prepared by mixing in the amount shown in Table 2 (calculated on the solid basis) so that an average protection percentage (pivaloylation and 1-ethoxyethylation percentage) becomes a value shown in the same table. Each resin solution, solid content of which being 13.5 parts, was mixed with 0.5 parts of bis(cyclohexylsulfonyl)diazomethane as an acid generator, 0.01 parts of tris[2-(2-methoxyethoxy)ethyl] amine as a quencher, 0.01 parts of tetrabutylammonium hydroxide as the other quencher, 0.135 parts of polypropylene glycol as a water rataining agent and 80 parts (including the amount from the resin solution) of propylene glycol monomethyl ether acetate. This solution was filtered through a fluororesin filter having a pore diameter of 0.1 μm to prepare a resist solution.

"DUV-42" (neutral) as a composition for organic anti-reflective film manufactured by Brewer Science Co. was coated on a silicon wafer washed by a conventional method, and then baked to form an anti-reflective film having a film thickness of 600 Å. Using a spin coater, the above resist solution was coated thereon so that a film thickness after drying becomes 0.52 μm. Then, this silicon wafer was prebaked on a hot plate at 90° C. for 90 seconds. The coated film after prebaking was exposed to light through a chromium mask having a semidense pattern with a width ratio of line to space of 1:1.5 while changing a dosage in steps, using a KrF excimer laser stepper having an exposure wavelength of 248 nm ["NSR-2205 EX12B" manufactured by Nicon Corp., NA=0.55 , σ=0.8]. The wafer after light exposure was heated on a hot plate at 100° C. for 90 seconds, thereby performing PEB, and then the deblocking reaction of the exposed portion was conducted. The reaction product was developed with an aqueous 2.38% solution of tetramethylammonium hydroxide to obtain a positive pattern.

The formed pattern was observed by an electron microscope, and then the effective sensitivity, depth of focus and profile were evaluated according to the following manner. The results are shown in Table 2.

Effective sensitivity: It was represented by a minimum dosage at which a cross section of a semidense line and space pattern having a line width of 0.18 μm (space width is 1.5 times as that, i.e. 0.27 μm) becomes 1:1.5, accurately.

Depth of focus: It was represented by a range of focus wherein a semidense line and space pattern having a line width of 0.18 μm and a space width of 0.27 μm is resolved at 1:1.5 when light exposure was conducted at a dosage of the effective sensitivity by moving the position of focus upward and downward. It is considered that a focus margin is wide, that is, good, if the depth of focus is not less than 1 μm.

Profile: It was judged by a cross-sectional shape of a semidense line and space pattern having a line width of 0.18 μm and a space width of 0.27 μm formed at a dosage of the effective sensitivity.

TABLE 2

| Run No. | Composition of resin (solid content) | Pivaloy- iation percen- tage | 1- ethoxy- ethyla- tion percen- tage | Effec- tive sensi- tivity | Depth of focus | Profile |
|---|---|---|---|---|---|---|
| 1 | R41/6.279 parts R45/7.221 parts | 10% | 20% | 28 mJ/cm$^2$ | 1.35 μm | Rectangular |
| 2 | R42/6.903 parts R46/6.597 parts | 10% | 20% | 28 mJ/cm$^2$ | 1.35 μm | Rectangular |
| 3 | R43/4.778 parts R47/8.722 parts | 10% | 20% | 26 mJ/cm$^2$ | 1.35 μm | Rectangular, Slightly round top |
| 4 | R44/3.989 parts R47/9.511 parts | 10% | 20% | 24 mJ/cm$^2$ | 1.35 μm | Rectangular, Round top |

EXAMPLE 4

The respective solutions of the resins R48 and R49 obtained in (4c) of Synthesis Example 4 were mixed in the amount of 4.385 parts and 9.115 parts (calculated on the solid basis) respectively to obtain a resin solution wherein the average povaloylation percentage is 10%, the average 1-ethoxyethylation percentage is 20% and the solid content is 13.5 parts. This resin solution was mixed with 0.5 parts of bis(cyclohexylsulfonyl)diazomethane as an acid generator, 0.05 parts of p-tolyldiphenylsulfonium p-toluenesulfonate as the other acid generator, 0.01125 parts of tris[2-(2-methoxyethoxy)ethyl]amine as a quencher, 0.03375 parts of tetrabutylammonium hydroxide as the other quencher, 0.135 parts of polypropylene glycol as a water retaining agent and 85 parts (including the amount from the resin solution) of propylene glycol monomethyl ether acetate. This solution was filtered through a fluororesin filter having a pore diameter of 0.1 μm to prepare a resist solution.

Using this resist solution, a test was conducted in the same manner as in Example 3. As a result, the effective sensitivity was 40 mJ/cm$^2$, the depth of focus was 1.8 μm and the profile was almost rectangular.

EXAMPLE 5

Two kinds of resins synthesized in accordance with Synthesis Example 4 were mixed to prepare a resin mixture wherein the pivaloylation percentage of the hydroxyl group of poly(p-vinylphenol) is 10% and the 1-ethoxyethylation percentage is 20%. The same test as in Example 3 was conducted, except that the resin and the quencher were replaced with the resin mixture obtained above and each quencher shown in Table 3, respectively. The results are shown in Table 3. In Table 3, quenchers are represented by the following abbreviations.

Kind of quenchers
 TMEA: tris[2-(2-methoxyethoxy)ethyl]amine
 TBAH: tetrabutylammonium hydroxide
 DCMA: methyldicyclohexylamine

TABLE 3

| Run No. | Quencher | Effective sensitivity | Depth of focus | Profile |
|---|---|---|---|---|
| 1 | TMEA 0.01 parts + TBAH 0.01 parts | 26 mJ/cm$^2$ | 1.35 μmm | Rectangular |
| 2 | TMEA 0.01 parts + DCMA 0.01 parts | 26 mJ/cm$^2$ | 1.35 μmm | Rectangular |
| 3 | TBAH 0.01 parts + DCMA 0.01 parts | 36 mJ/cm$^2$ | 1.35 μmm | Rectangular, Slightly round top |
| 4 | TBAH 0.02 parts | 30 mJ/cm$^2$ | 1.2 μmm | Retangular, Slightly round top |
| 5 | DCMA 0.02 parts | 36 mJ/cm$^2$ | 1.2 μmm | Rectangular, Slightly round top |

SYNTHESIS EXAMPLE 5

(5a) Partial Pivaloylation of Polyvinylphenol

In a flask, 1.2 kg (10.0 mol as p-vinylphenol unit) of poly(p-vinylphenol) and 6.0 kg of acetone were charged and stirred to dissolve the resin. After the completion of the dissolution, 151.6 g (1.5 mol, 0.15 equivalents based on hydroxyl group of poly(p-vinylphenol)) of triethylamine was added. After the solution was heated to 35° C., 120.4 g (1.0 mol, 0.1 equivalents based on hydroxyl group of poly(p-vinylphenol)) of pivaloyl chloride was added dropwise. After stirring at 35° C. for 3 hours, 6 kg of ether acetate and 4 kg of an aqueous 0.5% oxalic acid solution were added and a phase separation of the resulting solution was conducted. A phase separation after adding 4 kg of an aqueous 0 5% oxalic solution to this organic layer was conducted twice, followed by washing. To the resulting organic layer, 6 kg of ethyl acetate was added. Furthermore, a phase separation after washing the resulting organic layer with 3 kg of deionized water was conducted five times . The organic layer was concentrated by distilled off the solvent so that the amount of the solution is reduced to 2.8 kg. After 7.2 kg of ethyl acetate was added, the solution was concentrated by distilling off the solvent again to obtain 4.5 kg of a resin solution.

The concentration of the solid content of this resin solution was determined by an evaporation to dryness, and it was 31.0%. About 10% of the hydroxyl group of poly(p-vinylphenol) of this resin is converted into pivaloyl.

(5b) Partial 1-ethoxypropylation of Partially Pivaloylated Polyvinylphenol

In a flask, 1.5 kg (3.6 mol as original p-vinylphenol unit) of the resin solution obtained in the above (5a) , 0.21 g of 10-camphorsulfonic acid and 1.2 kg of ethyl acetate were charged, stirred and then heated to 35° C. Using a dropping funnel, 194.5 g (2.26 mol, 0.63 equivalents based on hydroxyl group of poly (p-vinylphenol)) of ethyl 1-propenyl ether was added dropwise over 20 minutes. After stirring at 35° C. for 3 hours, 929 g of ethyl acetate and 929 g of deionized water were added to the solution and a phase separation was conducted. Further, a phase separation after washing the resulting organic layer with 929 g of deionized water was conducted four times. After the organic layer was concentrated by distilled off the solvent, the residue was solvent-substituted by adding 2.1 kg of propyleneglycol monomethyl ether acetate and further distilling off the solvent to obtain 1.62 kg of a propylene glycol monomethyl ether acetate solution of the resin.

The concentration of the solid content of this resin solution was determined by an evaporation to dryness, and it was 33.8%. The proportion of the 1-ethoxypropylated group out of the hydroxyl group in poly(p-vinylphenol) was determined by using a NMR spectrometer. It was 26.1%.

(5c) Partial 1-ethoxypropylation of Partially Pivaloylated Polyvinylphenol

In a flask, 1.5 kg (3.6 mol as original p-vinylphenol unit) of the resin solution obtained in the above (5a) , 0.21 g of 10-camphorsulfonic acid and 1.2 kg of ethyl acetate were charged, stirred and then heated to 35° C. Using a dropping funnel, 166 g (1.93 mol, 0.53 equivalents based on hydroxyl group of poly(p-vinylphenol)) of ethyl 1-propenyl ether was added dropwise over 20 minutes. After stirring at 35° C. for 3 hours, 929 g of ethyl acetate and 929 g of deionized water were added to the solution and a phase separation was conducted. Further, a phase separation after washing the resulting organic layer with 929 g of deionized water was conducted four times. After the organic layer was concentrated by distilled off the solvent, the residue was solvent-substituted by adding 2.3 kg of propyleneglycol monomethyl ether acetate and further distilling off the solvent to obtain 1.46 kg of a propylene glycol monomethyl ether acetate solution of the resin.

The concentration of the solid content of this resin solution was determined by an evaporation to dryness, and it was 36.8%. The proportion of the 1-ethoxypropylated group out of the hydroxyl group in poly(p-vinylphenol) was determined by using a NMR spectrometer. It was 18.4%.

(5d) Adjustment of 1-ethoxypropylation Percentage

The resin solution obtained in the above (5b) and the resin solution obtained in the above (5c) were mixed in a weight ratio of 2.22:7.78 respectively to obtain a resin solution corresponding to the solid content concentration of 36.1%. Regarding this resin, the pivaloylation percentage of the hydroxyl group in poly(p-vinylphenol) is about 10% and the 1-ethoxypropylation percentage of the hydroxyl group is about 20%. This resin is referred to as a resin R5.

EXAMPLE 6

The same test as in Example 3 was conducted, except that the resin was changed to the resin R5 obtained in (5d) of Synthesis Example 5. As a result, the effective sensitivity was 28 mJ/cm$^2$, the depth of focus was 1.5 µm and the profile was almost rectangular.

EXAMPLE 7

The same test as in Example 4 was conducted, except that the resin was changed to the resin R5 obtained in (5d) of Synthesis Example 5. As a result, the effective sensitivity was 44 mJ/cm$^2$, the depth of focus was 1.8 µm and, the profile was almost rectangular.

EXAMPLE 8

The same test as in Example 5 was conducted, except that the resin was changed to the resin R5 obtained in (5d) of Synthesis Example 5. The results are shown in Table 4. The abbreviations representing the kind of quenchers in Table 4 are as explained in Example 5.

TABLE 4

| Run No. | Quencher | Effective sensitivity | Depth of focus | Profile |
| --- | --- | --- | --- | --- |
| 1 | TMEA 0.01 parts + TBAH 0.01 parts | 28 mJ/cm$^2$ | 1.5 µmm | Rectangular |
| 2 | TMEA 0.01 parts + DCMA 0.01 parts | 30 mJ/cm$^2$ | 1.5 µmm | Rectangular |
| 3 | TBAH 0.01 parts + DCMA 0.01 parts | 36 mJ/cm$^2$ | 1.5 µmm | Rectangular, Slightly round top |
| 4 | TBAH 0.02 parts | 30 mJ/cm$^2$ | 1.2 µmm | Retangular, Slightly round top |
| 5 | DCMA 0.02 parts | 36 mJ/cm$^2$ | 1.2 µmm | Rectangular, Slightly round top |

EXAMPLE 9

The respective solutions of the resins R48 and R49 obtained in (4c) of Synthesis Example 4, resin RX1 obtained in (3a) of Synthesis Example 3 and resin RX2 obtained in (3b) of Synthesis Example 3 were prepared by mixing in the amount shown in Table 5 (calculated on the solid basis) so that an average protection percentage becomes a value shown in the same table. Each resin solution, the solid content of which being 13.5 parts, was mixed with 0.2 parts of bis(cyclohexylsulfonyl)diazomethane as an acid generator, 0.1 parts of bis(p-tolylsulfonyl)diazomethane as the other acid generator, 0.01 parts of methyldicyclohexylamine as a quencher, 0.006 parts of tetrabutylammonium hydroxide as the other quencher, 0.135 parts of polypropylene glycol as a water retaining agent, 0.01 parts of succinimide as a substrate dependence modifier and 65 parts (including the amount from the resin solution) of propylene glycol monomethyl ether acetate. This solution was filtered through a fluororesin filter having a pore diameter of 0.1 µm to prepare a resist solution.

Figure 1:
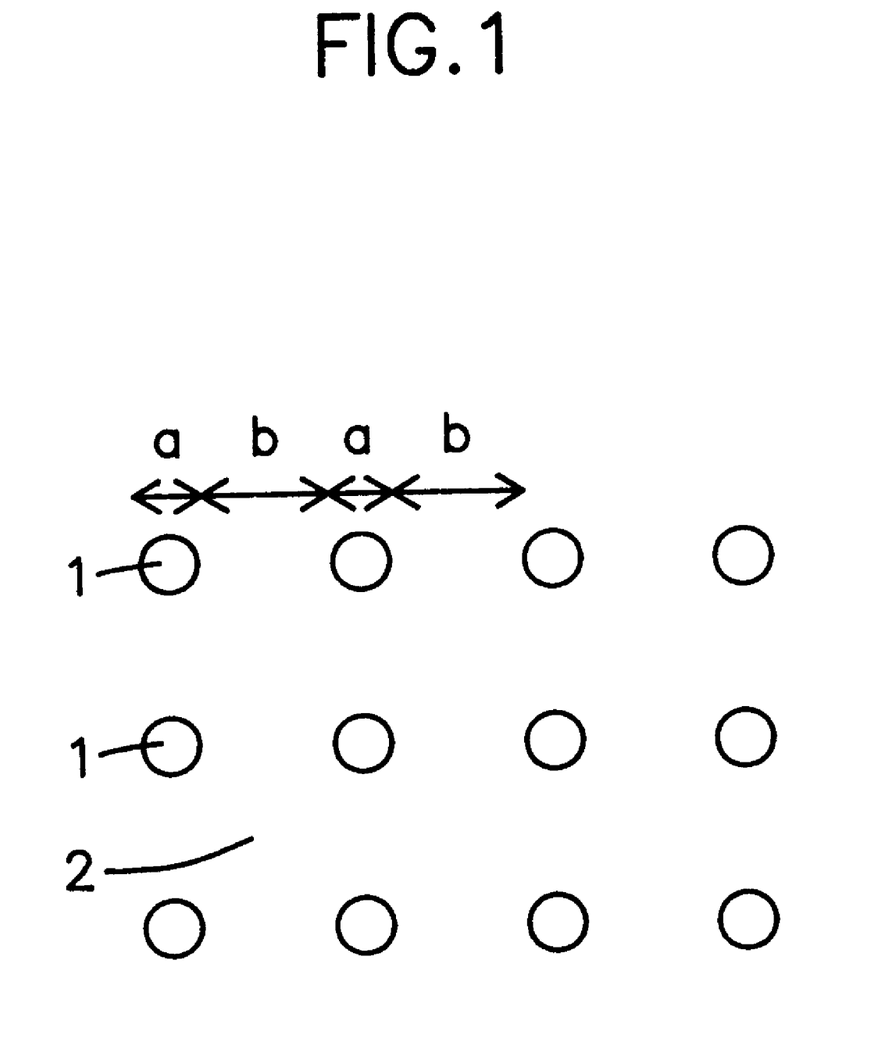
FIG. 1 is a partially enlarged planar view of the contact hole pattern formed in Example 9.

Using a spin coater, the above resist solution was coated on a silicon wafer washed by a conventional method so that a film thickness after drying becomes 0.66 µm. Then, this silicon wafer was prebaked on a hot plate at 90° C. for 60 seconds. The coated film after prebaking was exposed to light through a chromium mask having a pattern of contact hole while changing a dosage in steps, using a KrF excimer laser stepper having an exposure wavelength of 248 nm ["NSR-2205 EX12B" manufactured by Nicon Corp., NA=0.55, σ=0.8]. After the completion of the light exposure, the wafer was heated on a hot plate at 105° C. for 60 seconds, thereby performing PEB, and then the deblocking reaction of the exposed portion was conducted. The reaction product was developed with an aqueous 2.38% solution of tetramethylammonium hydroxide to obtain a positive pattern. Although the portion for exposure in chromium mask was square, in the positive pattern thus obtained, the exposed portion is converted into a columnar hole 1 as shown in FIG. 1 and the surrounding unexposed portion is remained as an image 2. In this example, the ratio of diameter "a" of the hole 1 to the closest distance "b" between adjacent hole walls (pitch a:b) is to be 1:2.

The formed pattern was observed by an electron microscope, and then the effective sensitivity, depth of focus and profile were evaluated in the following manner. The results are shown in Table 5.

Effective sensitivity: It was represented by a minimum dosage required to form a contact hole having a hole diameter of 0.25 µm at a pitch (a:b) of 1:2.

Depth of focus: It was represented by a range of focus wherein a contact hole having a hole diameter of 0.25 µm is resolved accurately at a pitch (a:b) of 1:2 when light exposure was conducted at a dosage of the effective sensitivity by moving the position of focus upward and downward. It is considered that a focus margin is wide, that is, good, if the depth of focus is not less than 1 µm.

Profile: It was judged by a cross-sectional shape of a contact hole pattern having a hole diameter of 0.25 µm formed at a dosage of the effective sensitivity.

TABLE 5

| Run No. | Composition of resin (solid content) | Pivaloyiation percentage | 1-ethoxyethylation percentage | Effective sensitivity | Depth of focus | Profile |
| --- | --- | --- | --- | --- | --- | --- |
| 1 | R48/6.750 parts RX1/6.373 parts RX2/0.377 parts | 5% | 34% | 42 mJ/cm$^2$ | 1.05 µm | Rectangular |
| 2 | R49/4.050 parts RX1/9.450 parts | 3% | 34% | 40 mJ/cm$^2$ | 1.05 µm | Rectangular |
| 3 (Comparison) | RX1/8.292 parts RX2/5.20 parts | — | 34% | 35 mJ/cm$^2$ | 0.75 µm | Round top |

The photoresist composition of the present invention using a resin having the respective structural units represented by the above formulas (I), (II) and (III) affords excellent resolution and excellent profile in the exposed area of high-energy radiation. On a substrate provided with an organic anti-reflective film, excellent profile is afforded and a focus margin is also wide. Accordingly, by using the composition of the present invention, a fine photoresist pattern with high accuracy can be formed.

What is claimed is:

1. A photoresist composition comprising a resin having, in one molecule, the respective structural units represented by the following formulas (I), (II) and (III):

wherein $R^1$, $R^2$, $R^3$, $R^{11}$, $R^{12}$, $R^{13}$, $R^{21}$, $R^{22}$ and $R^{23}$ each independently represents hydrogen or an alkyl having 1 to 4 carbon atoms; one of $R^{14}$, $R^{15}$ and $R^{16}$ represents an aliphatic hydrocarbon residue and the rest each independently represents hydrogen or an aliphatic hydrocarbon residue, or two or three of $R^{14}$, $R^{15}$ and $R^{16}$ are combined each other together with a carbon atom to which they are bonded to form a hydrocarbon ring; and R represents a group cleavable by an action of an acid.

2. The photoresist composition according to claim 1 wherein $R^1$, $R^2$, $R^{11}$, $R^{12}$, $R^{21}$ and $R^{22}$ represent hydrogen and $R^3$, $R^{13}$ and $R^{23}$ each independently represent hydrogen or methyl.

3. The photoresist composition according to claim 1 wherein $R^{14}$, $R^{15}$ and $R^{16}$ in the formula (II) each represents methyl.

4. The photoresist composition according to claim 1 wherein the proportion of the structural unit represented by the formula (II) is within a range from 1 to 30% by mol.

5. The photoresist composition according to claim 1 wherein R in the formula (III) is represented by the following formula (IIIa):

wherein $R^{24}$ represents hydrogen or an alkyl having 1 to 4 carbon atoms; $R^{25}$ represents an alkyl having 1 to 4 carbon atoms; and $R^{26}$ represents an alkyl or a cycloalkyl or $R^{25}$ and $R^{26}$ are combined each other to form an alkylene chain which may be substituted with an alkoxy.

6. The photoresist composition according to claim 1 wherein the proportion of the structural unit represented by the formula (III) is within a range from 10 to 70% by mol.

7. The photoresist composition according to claim 1 which further comprises an acid generator and is a chemical amplification positive type photoresist.

8. The photoresist composition according to claim 7 wherein the acid generator comprises a compound having a diazomethanedisulfonyl skeleton.

9. The photoresist composition according to claim 8 wherein the compound having a diazomethanedisulfonyl skeleton is bis(cycloalkylsulfonyl)diazomethane.

10. The photoresist composition according to claim 8 wherein the acid generator further comprises an onium salt.

11. The photoresist composition according to claim 10 wherein the onium salt is p-tolyldiphenylsulfonium p-toluenesulfonate or p-tolyldiphenylsulfonium trifluoromethanesulfonate.

12. The photoresist composition according to claim 7 which further comprises an organic base compound.

* * * * *